United States Patent [19]
Webster et al.

[11] Patent Number: 4,891,790
[45] Date of Patent: Jan. 2, 1990

[54] OPTICAL SYSTEM WITH AN OPTICALLY ADDRESSABLE PLANE OF OPTICALLY BISTABLE MATERIAL ELEMENTS

[75] Inventors: Lee O. Webster; Larry Z. Kennedy; Joseph G. Duthie, all of Huntsville, Ala.

[73] Assignee: United States of America as represented by the Secretary of the Army, Washington, D.C.

[21] Appl. No.: 173,915

[22] Filed: Mar. 28, 1988

[51] Int. Cl.$^4$ .................... G11C 11/42; G11C 13/04
[52] U.S. Cl. .................................... 365/127; 365/122; 369/121; 369/122
[58] Field of Search ............... 365/127, 124, 122, 215, 365/113, 119, 106; 369/121, 122, 13

[56] References Cited

U.S. PATENT DOCUMENTS

| | | | |
|---|---|---|---|
| 3,573,362 | 4/1971 | Burchardt | 365/127 |
| 3,833,894 | 9/1974 | Aviram et al. | 365/151 |
| 4,229,072 | 10/1980 | Torok et al. | 365/122 |
| 4,288,861 | 9/1981 | Swainson et al. | 365/127 X |
| 4,660,187 | 4/1987 | Yoshimo et al. | 365/122 |
| 4,663,738 | 5/1987 | Sprague et al. | 365/127 X |
| 4,707,787 | 11/1987 | Savit et al. | 365/127 |
| 4,779,250 | 10/1988 | Kogure et al. | 365/122 |

Primary Examiner—Stuart N. Hecker
Assistant Examiner—Alfonso Garcia
Attorney, Agent, or Firm—Freddie M. Bush; James T. Deaton

[57] ABSTRACT

This device is an all-optical digital architecture for carrying out computations. Residue number system addition and multiplication tables are produced on an optically-addressable plane composed of optically bistable material. The plane of optically bistable material devices represents a residue number system addition or multiplication tables and is addressed by two intersecting signal beams from the top and a bias beam from the bottom. A combination of two signal beams exceeds the material transmission threshold in the intersection region letting bias light emerge as a position encoded signal beam.

6 Claims, 1 Drawing Sheet

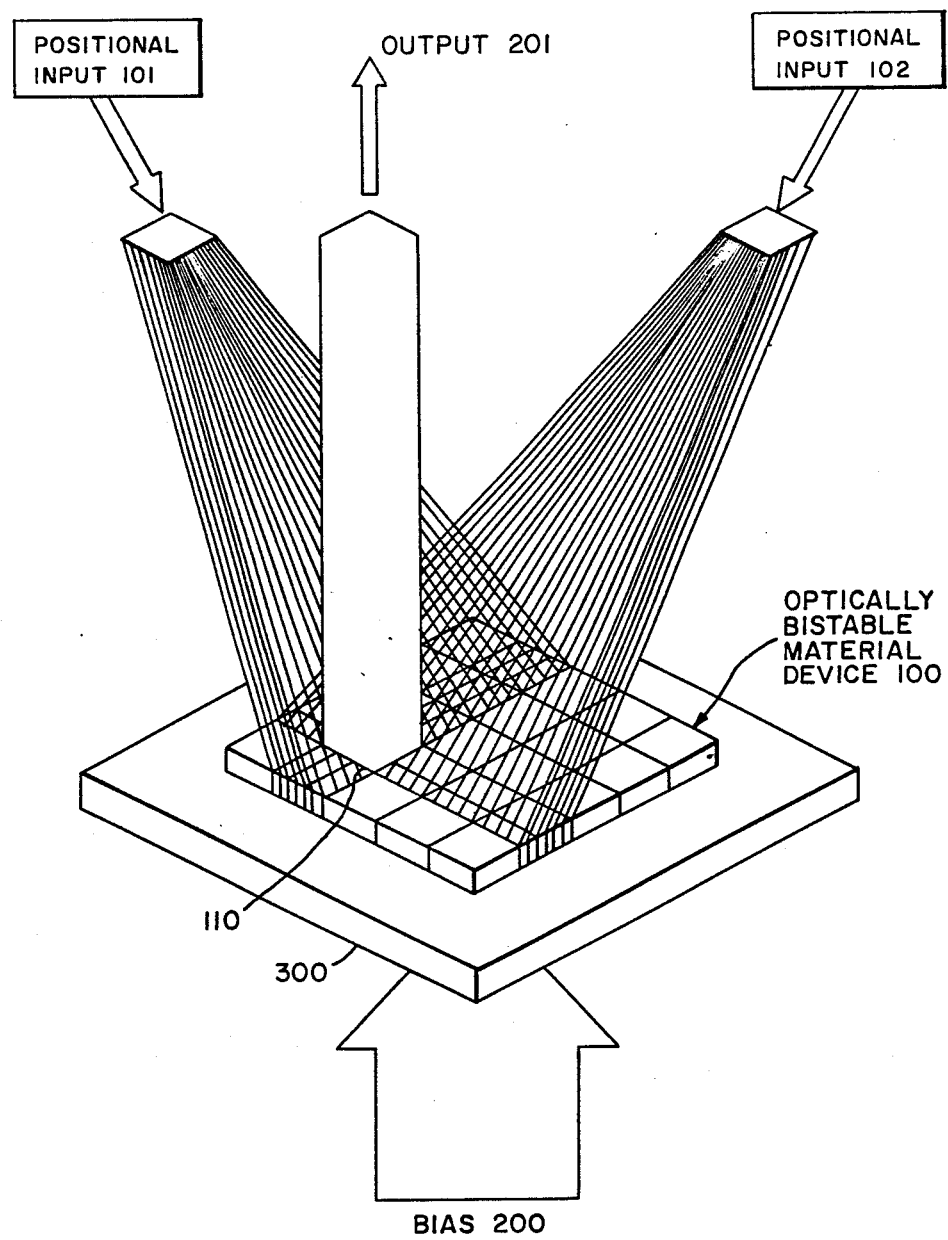

OPTICAL SYSTEM WITH AN OPTICALLY ADDRESSABLE PLANE OF OPTICALLY BISTABLE MATERIAL ELEMENTS

DEDICATORY CLAUSE

The invention described herein may be manufactured, used, and licensed by or for the Government for governmental purposes without the payment to us of any royalties thereon.

BACKGROUND OF THE INVENTION

All-optical digital (AOD) computing has the potential to become the ultimate computing technology for speed and throughput. Computation intensive problems of the present and future, such as real time image processing and analysis, synthetic aperture radar (SAR) processing, and $BM/C^3$ processing for SDI, may best be solved through optical rather than electronic computing. All-optical computing is a technology now ripe for development as a result of the ability to design materials (called optically bistable or non-linear materials) which mediate "light interacting with light" to provide switching and memory functions. Such a technology would have several characteristics which indicate its superiority for high throughput computation:

1. The use of light as a signal of low dispersion, maximum speed and bandwith
2. The use of optics with its inherent parallelism allowing massively concurrent computation
3. The use of light to accomplish global and "crosstalk" free interconnects not realizable electronically
4. The potential of optically non-linear materia with ultrafast subpicosecond switching.

Clearly such characteristics would be expected for the computer with ultimate performance in speed and throughput. It has the additional potential of being intrinsically radiation hardened.

The present invention approaches the characteristics of the ultimate computer in the above senses. In addition, these architectures are based on the residue (instead of binary) number system with its economy of "no carriers" (its position gives the complete number). Since this allows even further parallelism and results in the property that numerically precise computation requires no additional time.

SUMMARY OF THE INVENTION

This invention is an all-optical digital architecture for carrying out computations. Residue number system addition and multiplication tables are produced on an optically-addressable plane composed of an array of optically bistable elements. The plane of optically bistable material devices that represents a residue number system addition or multiplication tables (addition and multiplication tables for radix 5 are shown) is addressed by two intersecting signal beams from the top and a bias beam from the bottom. Where two signal beams across the material the combination of light input exceeds the material transmission threshold in the intersection region letting bias emerge as a position encoded signal beam.

The residue number system functions in the following manner: a number is represented by its set of remainders upon division by a set of relatively prime numbers or radices. This provides a mechanism for performing arithmetic operations independently on the remainder with respect to a given a prime. This yields a highly parallel computational structure, each channel is called a "residue plane". In this invention, all devices and algorithm implementations are described on a single residue plane that is usually physically identical to a plane of optically bistable device elements.

These residue arithmetic devices are addressed with two light signals representing inputs to an operation. The device then switches producing a third light signal output whose position represents the result of that operation.

BRIEF DESCRIPTION OF THE DRAWING

The single figure is a diagramtic showing of the present invention.

DETAILED DESCRIPTION OF THE PREFERRED EMBODIMENT

Optically bistable elements offer the potential of ultra-fast, sub-picosecond switching and cycling; whereas electro-optical devices are, as yet, much slower. As a signal processor, an AOD system may require an electro-optical modulator for input since data usually originates in electronic or analog form. Nevertheless, in many of the important problems, computation which utilizes the data is the bottleneck, even when the data is inputed as fast as it is produced.

The present invention optically configures digital information in such a manner that the advantages of optics, mentioned above, can apply. This occurs through the implementation of residue number system addition and multiplication tables as basic micro devices realized on an optically addressable plane of optically bistable material. (See the Figure)

In the residue number system, (see tables at the end of the specification), a number is represented by its set of remainders upon division by a set of relatively prime numbers or radices. Its advantage is that arithmetic operations can be performed independently on the remainders with respect to a given prime, which yields a highly parallel computational structure, each channel of which we call a "residue plane". Also, the addition and multiplication device tables have only a finite number of elements (outcomes). In the following, all devices and algorithm implementations are described on a single residue plane which is usually physically identical to a plane 100 of rows and columns of optically bistable device elements arranged as an array. A five×five array 100 is shown; however, larger arrays can be used resulting in a much larger table.

Referring to the drawing, these residue arithmetic devices are addressed with two light signals 101 and 102 representing inputs to an operation. The light signals are spread across a row or column of the plane 100 in accordance to data input. Where the two input signals cross the single bistable element 110 switches from an opague state to a transparent state as the combination of the two beams exceeds the material transmission threshold of the bistable element. This allows bias light 200 to pass through the transparent switched bistable element 110. Arrays of these devices can be cascadable on planes, for 1×N architectures, (not shown) or channels of planes for N×N architectures, (not shown) with each plane or channel associates with a single radix of the residue number system basis. Signal intensity is maintained since it is the bias light energy 200 from each bistable device which becomes the signal 201 for the next device. A fan out of 201 numerically equivalent to the radix for that channel will be required. The bistable devices can be made of gallium, aluminum arsenide GaAlAs super lattice. Each is mounted on a transparent plate 300 such as glass.

The best method of performing interconnects between devices has not yet been determined; however both free space and guided wave methods should be considered. Both of these methods have considerable technology base although further developments will be required.

TABLES

| Addition | | | | | | Multiplication | | | | | |
|---|---|---|---|---|---|---|---|---|---|---|---|
|   | 0 | 1 | 2 | 3 | 4 |   | 0 | 1 | 2 | 3 | 4 |
| 0 | 0 | 1 | 2 | 3 | 4 | 0 | 0 | 0 | 0 | 0 | 0 |
| 1 | 1 | 2 | 3 | 4 | 0 | 1 | 0 | 1 | 2 | 3 | 4 |
| 2 | 2 | 3 | 4 | 0 | 1 | 2 | 0 | 2 | 4 | 1 | 3 |
| 3 | 3 | 4 | 0 | 1 | 2 | 3 | 0 | 3 | 1 | 4 | 2 |
| 4 | 4 | 0 | 1 | 2 | 3 | 4 | 0 | 4 | 3 | 2 | 1 |

We claim:

1. An optical system comprising a plurality of discrete optically bistable material elements each having a material transmission threshold illumination level and being arranged in an array having rows and columns of the elements; said elements being normally opaque to light but being switchable to a transparent-to-light state when said threshold level of illumination is exceeded; first and second signal light beams positioned on one side of the array with each having a strength of illumination such that when combined onto a single element, the threshold level is exceeded and that element will allow illumination to pass through, but when only one signal is on a single element, the threshold level is not exceeded and that element will block illumination from flowing therethrough; and said signal beams being directed on said array such that the first beam will illuminate a single row and the second beam will illuminate a single column whereby a single element in the array will have its threshold level exceeded.

2. A system as set forth in claim 1, whereby the plurality of elements are at least twenty-five in number.

3. A system as set forth in claim 2, wherein said elements are in a single plane and are arranged in mathematical order.

4. A system as set forth in claim 1, further having a bias illumination on the other side of the array, whereby the bias illumination will pass through only the signal element that has its threshold exceeded, and the position the passed through illumination representing the output of the system.

5. A system as set forth in clam 4, whereby the plurality of elements are at least twenty-five in number.

6. A system as set forth in claim 5, wherein said elements are in a single plane and are arranged in mathematical order.

* * * * *